United States Patent
Saiki et al.

(10) Patent No.: US 9,652,700 B2
(45) Date of Patent: May 16, 2017

(54) POWER DETECTION DEVICE, IMAGE FORMING APPARATUS, AND POWER DETECTION METHOD

(71) Applicant: FUJI XEROX CO., LTD., Tokyo (JP)

(72) Inventors: Takaki Saiki, Kanagawa (JP); Seiji Honda, Kanagawa (JP); Tomokazu Akuta, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/954,291

(22) Filed: Nov. 30, 2015

(65) Prior Publication Data

US 2016/0371572 A1 Dec. 22, 2016

(30) Foreign Application Priority Data

Jun. 22, 2015 (JP) .................................. 2015-124433

(51) Int. Cl.
| | | |
|---|---|---|
| *H02M 5/42* | (2006.01) | |
| *G06K 15/00* | (2006.01) | |
| *G01R 19/175* | (2006.01) | |
| *G01R 21/00* | (2006.01) | |
| *G01R 21/06* | (2006.01) | |
| *G06K 15/12* | (2006.01) | |
| *G03G 15/00* | (2006.01) | |

(52) U.S. Cl.
CPC ....... *G06K 15/4055* (2013.01); *G01R 19/175* (2013.01); *G01R 21/006* (2013.01); *G01R 21/06* (2013.01); *G03G 15/80* (2013.01); *G06K 15/129* (2013.01); *Y02B 70/126* (2013.01)

(58) Field of Classification Search
CPC .......... Y02B 70/126; G05F 1/33; H02M 1/32; H02M 3/156
USPC ............... 363/84, 89, 90, 126; 323/207, 222
See application file for complete search history.

(56) References Cited

U.S. PATENT DOCUMENTS

| | | | |
|---|---|---|---|
| 8,615,179 B2 | 12/2013 | Yamaguchi et al. | |
| 2006/0158912 A1* | 7/2006 | Wu ..................... | H02M 1/4225 363/89 |
| 2009/0245847 A1 | 10/2009 | Yuda | |
| 2013/0077365 A1* | 3/2013 | Chalermboon ..... | H02M 1/4208 363/89 |
| 2013/0342139 A1* | 12/2013 | Shimomugi .......... | H02M 7/066 318/400.3 |

FOREIGN PATENT DOCUMENTS

| | | |
|---|---|---|
| JP | 2007-163603 A | 6/2007 |
| JP | 2010-181633 A | 8/2010 |

* cited by examiner

*Primary Examiner* — Nguyen Tran
(74) *Attorney, Agent, or Firm* — Oliff PLC

(57) ABSTRACT

A power detection device includes a first zero-crossing detector, a current detector, and a second zero-crossing detector. The first zero-crossing detector detects zero-crossing timing of an alternating voltage of power supplied from a commercial power supply and outputs a voltage zero-crossing signal. The current detector detects current of the power. The second zero-crossing detector detects zero-crossing timing of the current detected by the current detector and outputs a current zero-crossing signal. A power factor is obtained based on a phase difference between the voltage zero-crossing signal and the current zero-crossing signal, and active power is calculated based on a root-mean-square value of the alternating voltage, a root-mean-square value of the current, and the obtained power factor.

4 Claims, 6 Drawing Sheets

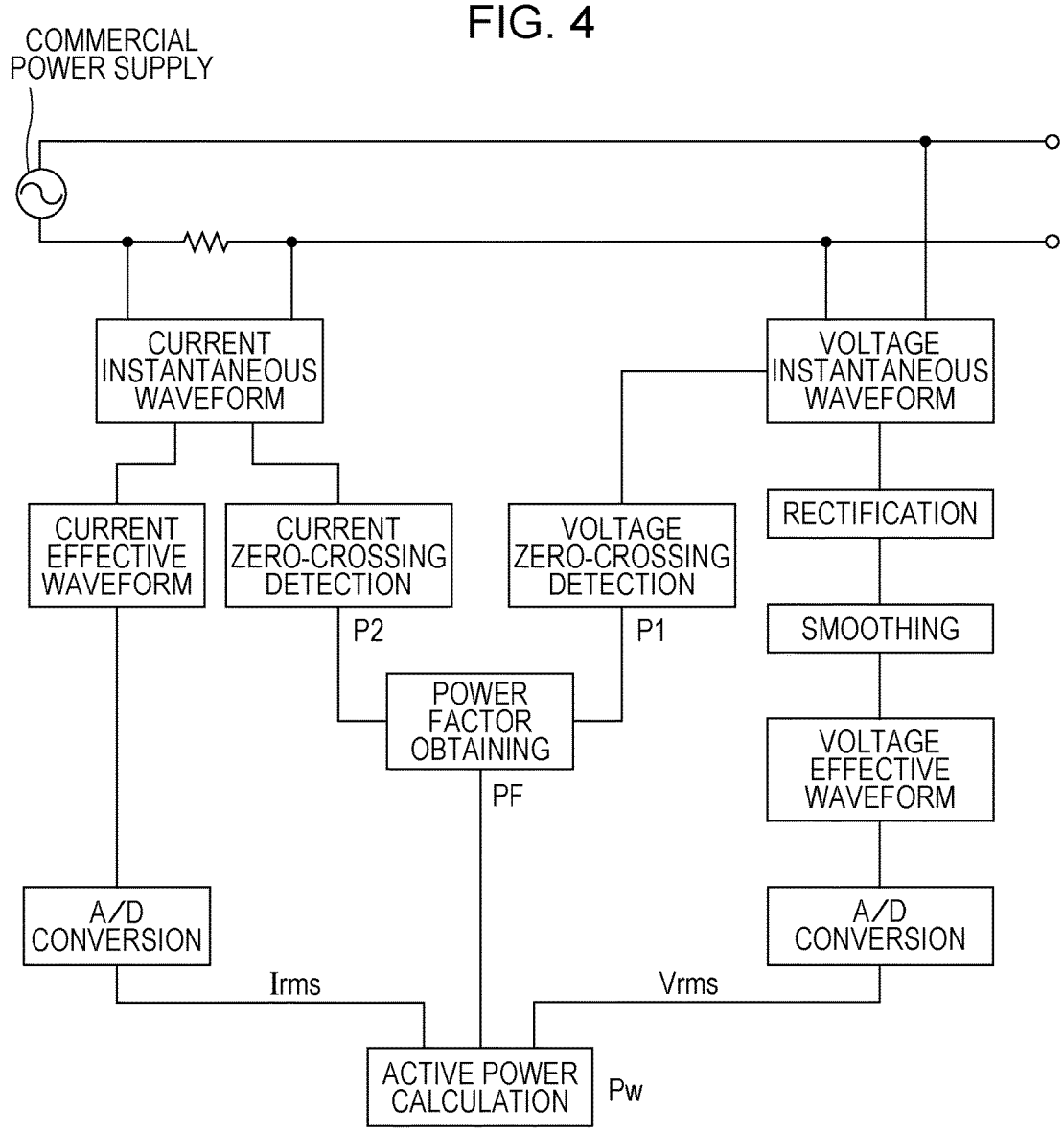

FIG. 5A  INSTANTANEOUS WAVEFORM  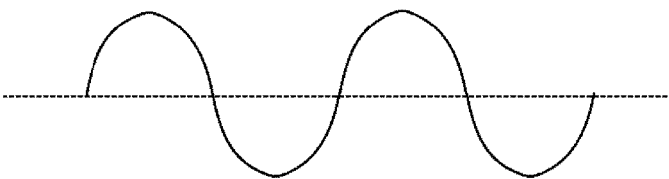
FIG. 5B  CR1, CR3  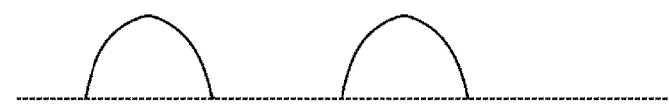
FIG. 5C  CR2, CR4  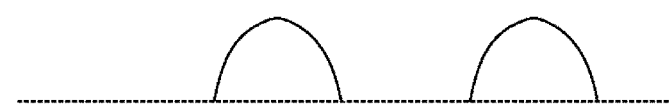
FIG. 5D  Ipc  
FIG. 5E  P  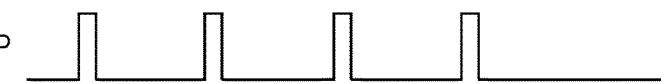

POWER DETECTION DEVICE, IMAGE FORMING APPARATUS, AND POWER DETECTION METHOD

CROSS REFERENCE TO RELATED APPLICATIONS

This application is based on and claims priority under 35 USC 119 from Japanese Patent Application No. 2015-124433 filed Jun. 22, 2015.

BACKGROUND

Technical Field

The present invention relates to a power detection device, an image forming apparatus, and a power detection method.

SUMMARY

According to an aspect of the invention, there is provided a power detection device including a first zero-crossing detector, a current detector, and a second zero-crossing detector. The first zero-crossing detector detects zero-crossing timing of an alternating voltage of power supplied from a commercial power supply and outputs a voltage zero-crossing signal. The current detector detects current of the power. The second zero-crossing detector detects zero-crossing timing of the current detected by the current detector and outputs a current zero-crossing signal.

A power factor is obtained based on a phase difference between the voltage zero-crossing signal and the current zero-crossing signal, and active power is calculated based on a root-mean-square value of the alternating voltage, a root-mean-square value of the current, and the obtained power factor.

BRIEF DESCRIPTION OF THE DRAWINGS

An exemplary embodiment of the present invention will be described in detail based on the following figures, wherein:

FIG. 4 is a functional block diagram illustrating active power calculation based on zero-crossing signal detection performed by a power detection device;

FIGS. 5A, 5B, 5C, 5D, and 5E are each a chart illustrating a waveform of a zero-crossing signal detected at a corresponding one of components of a zero-crossing signal detection circuit;

DETAILED DESCRIPTION

The present invention will be described further in detail with reference to the drawings by hereinafter describing an exemplary embodiment and taking specific examples. However, the present invention is not limited to the exemplary embodiment and the specific examples.

It is to be noted that the drawings are merely schematic in the following description given with reference to the drawings, and the proportions and the like of dimensions are different from actual values. Members except those required to be explained for easy understanding are not illustrated as appropriate.

(1) Overall Configuration and Operation of Image Forming Apparatus

Figure 1:
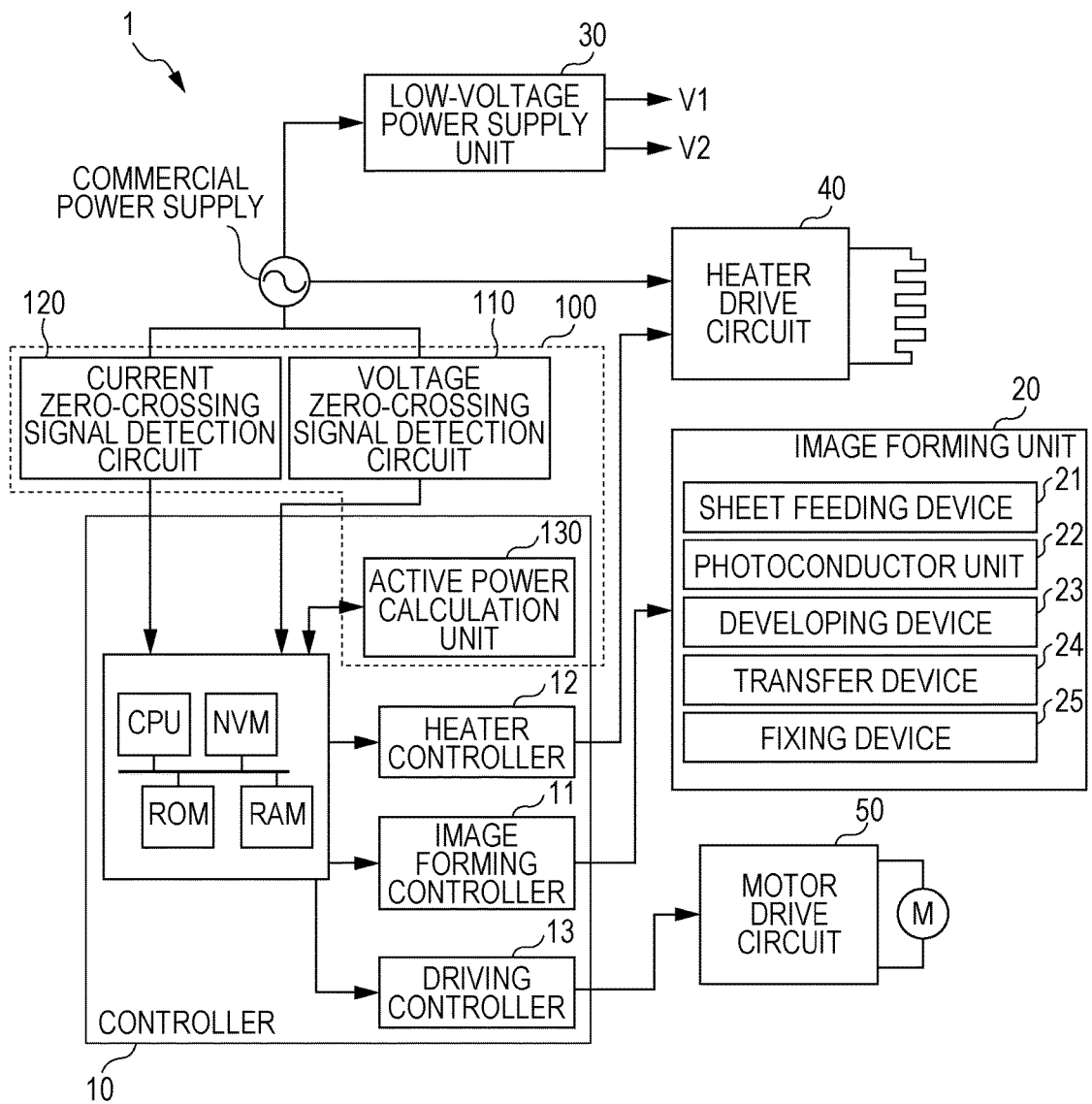
FIG. 1 is a block diagram illustrating an example of a functional configuration of an image forming apparatus.
Figure 2:
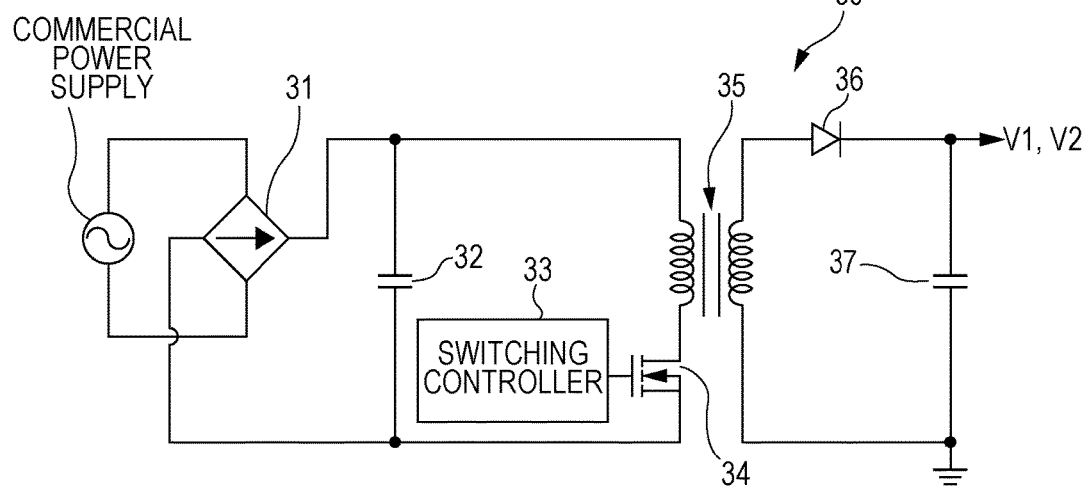
FIG. 2 is a circuit configuration diagram illustrating an example of a low-voltage power supply unit.
Figure 3:
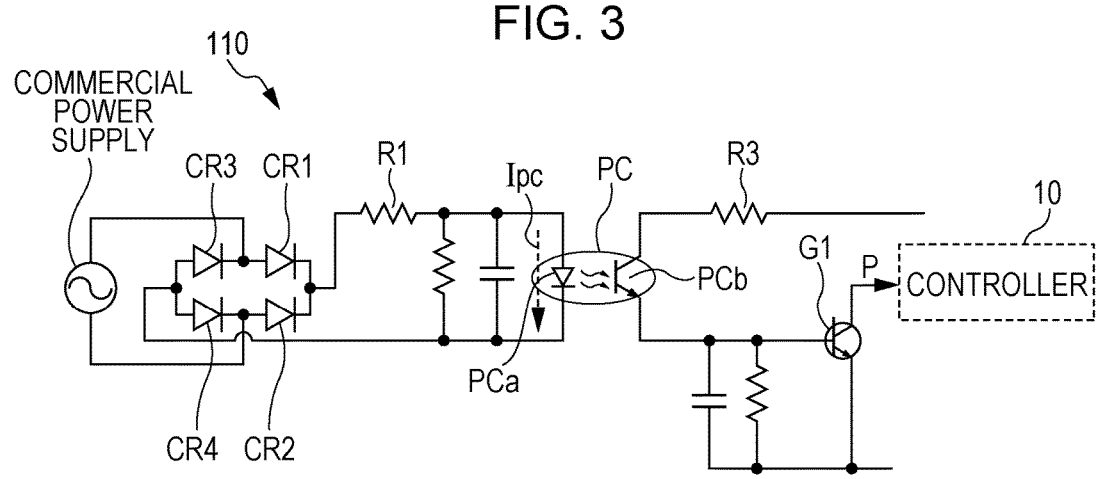
FIG. 3 is a circuit configuration diagram illustrating an example of a voltage zero-crossing signal detection circuit.

FIG. 1 is a block diagram illustrating a functional configuration of an image forming apparatus 1 including a power detection device 100 according to the present exemplary embodiment. FIG. 2 is a circuit configuration diagram illustrating an example of a low-voltage power supply unit 30. FIG. 3 is a circuit configuration diagram illustrating an example of a voltage zero-crossing signal detection circuit 110.

The overall configuration and operation of the image forming apparatus 1 will be described with reference to the drawings.

The image forming apparatus 1 includes a controller 10, an image forming unit 20, the low-voltage power supply unit 30, a heater drive circuit 40, a motor drive circuit 50, and the power detection device 100.

The controller 10 includes an image forming controller 11 that controls operation of the image forming unit 20 of the image forming apparatus 1, a heater controller 12 that controls the heater drive circuit 40, a driving controller 13 that controls the motor drive circuit 50, and an active power calculation unit 130 included in the power detection device 100.

The image forming unit 20 includes a sheet feeding device 21, photoconductor units 22, developing devices 23, and a transfer device 24. The transfer device 24 simultaneously transfers color toner images onto a sheet fed from the sheet feeding device 21, the color toner images each being formed by the corresponding photoconductor unit 22 and the corresponding developing device 23.

The sheet on which the toner images have been transferred by the transfer device 24 but have not yet been fixed is transported to a fixing device 25. The toner images are fixed on the sheet by utilizing effects of pressure contact and heating.

The low-voltage power supply unit 30 includes a bridge rectifier diode 31 that performs full-wave rectification on an alternating voltage supplied from a commercial power supply, a smoothing capacitor 32 that smooths the full-wave rectified voltage, and a switching controller 33. A switching element 34 (field effect transistor (FET)) for direct current/alternating current (DC/AC) conversion and a transformer 35 are connected in series on the output side of the smoothing capacitor 32, the switching element 34 being turned on/off by the switching controller 33.

A rectifier diode 36 and a smoothing capacitor 37 are connected on the output side of the transformer 35. The rectifier diode 36 rectifies an AC output voltage, and the smoothing capacitor 37 smooths the rectified voltage and outputs a low DC voltage. The low DC voltage is output as a voltage V1 and a voltage V2. The voltage V1 is input to the controller 10, the voltage zero-crossing signal detection circuit 110, a current zero-crossing signal detection circuit 120, the heater drive circuit 40, the motor drive circuit 50, and other components. The voltage V2 is input to actuators (not illustrated) of the respective components and other components.

The power detection device 100 includes the voltage zero-crossing signal detection circuit 110 serving as a first zero-crossing detector, the current zero-crossing signal detection circuit 120 serving as a second zero-crossing detector, and the active power calculation unit 130 included in the controller 10. The voltage zero-crossing signal detection circuit 110 detects a zero-crossing signal of the alternating voltage supplied from the commercial power supply. The current zero-crossing signal detection circuit 120 detects a zero-crossing signal by detecting current of the power.

The voltage zero-crossing signal detection circuit 110 has four diodes CR1, CR2, CR3, and CR4 that perform full-wave rectification in which an alternating voltage is converted into a direct current voltage. One end of a current limiting resistor R1 is connected to the cathode side of the diodes CR1 to CR4. A photo-coupler PC is connected to the other end of the current limiting resistor R1 and to the anode side of the diodes CR3 and CR4.

The photo-coupler PC includes a photodiode PCa for emitting light and a phototransistor PCb for receiving the light. The photodiode PCa is connected to the other end of the current limiting resistor R1 and to the anodes of the respective diodes CR3 and CR4. The phototransistor PCb has a collector to which a DC voltage (not illustrated) is applied via a pull-up resistor R3 and an emitter connected to the base of a transistor G1.

When a current Ipc flows from the anode of the photodiode PCa to the cathode thereof, the photodiode PCa emits light. The light is received at the gate of the phototransistor PCb, and a zero-crossing signal P is output from the emitter of the phototransistor PCb.

The zero-crossing signal P is amplified in the transistor G1 and input to the controller 10.

(2) Power Detection Device

Figure 6A:
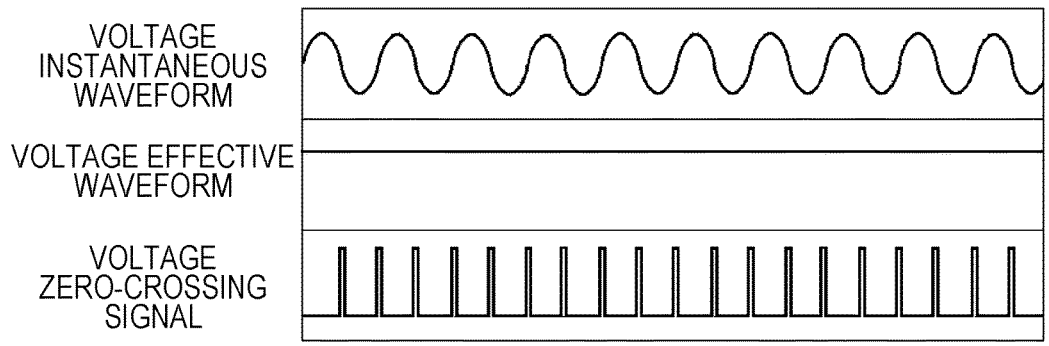
FIGS. 6A, 6B, and 6C are diagrams for explaining power factor obtaining performed on the basis of zero-crossing signal detection.
Figure 6B:
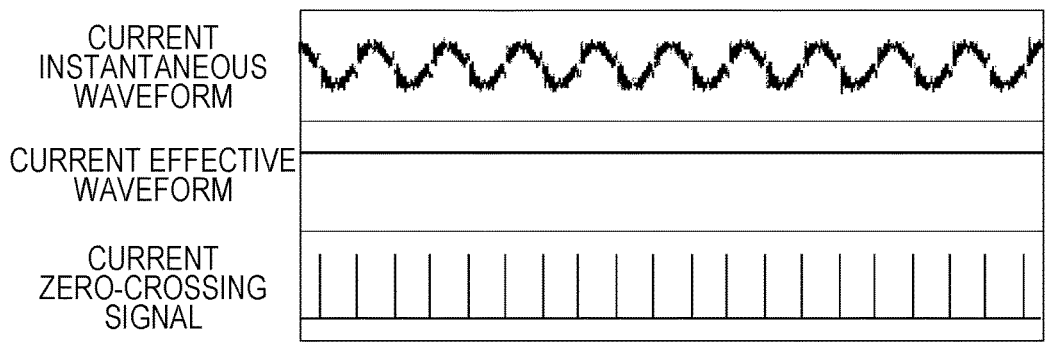
Figure 6C:
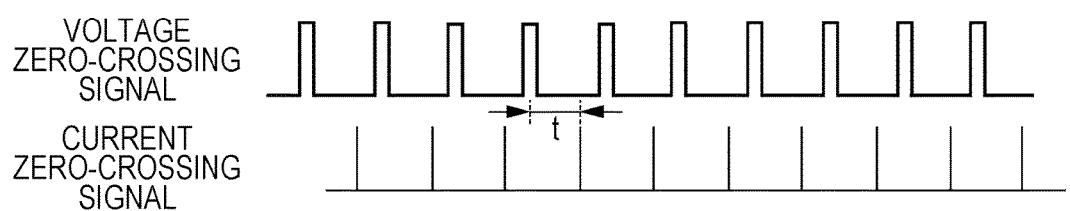
Figure 7:
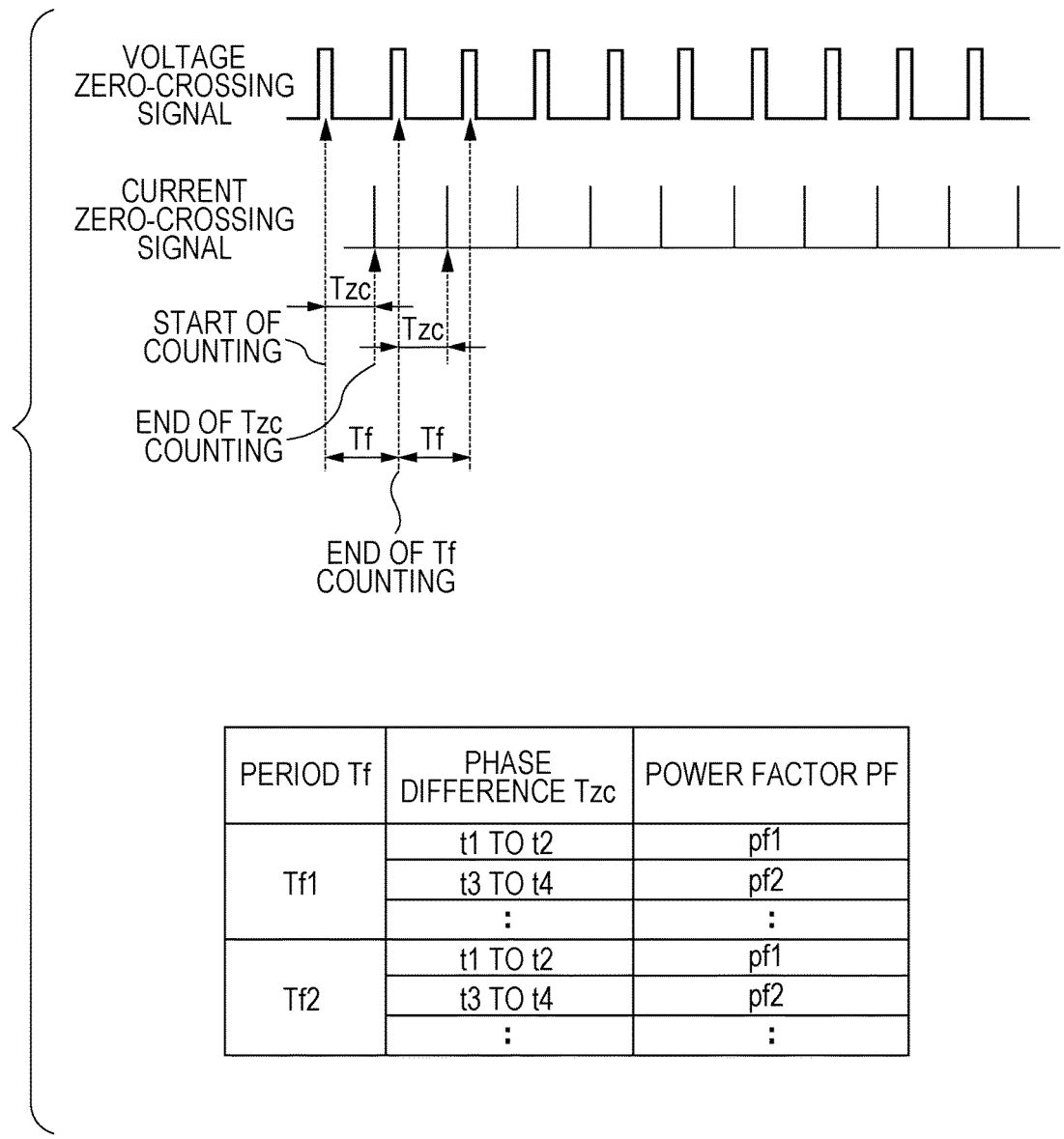
FIG. 7 is an example of a power factor table that is referred to when a power factor is obtained.

FIG. 4 is a functional block diagram illustrating active power calculation based on zero-crossing signal detection performed by the power detection device 100. FIGS. 5A, 5B, 5C, 5D, and 5E are each a chart illustrating a waveform of a zero-crossing signal detected at a corresponding one of components of a zero-crossing signal detection circuit. FIGS. 6A, 6B, and 6C are diagrams for explaining power factor obtaining performed on the basis of zero-crossing signal detection. FIG. 7 is an example of a power factor table that is referred to when a power factor is obtained.

Hereinafter, the configuration and operation of the power detection device 100 will be described with reference to the drawings.

The low-voltage power supply unit 30 converts AC power input from the commercial power supply into low voltage power (such as 24 V or 5 V) and supplies the low voltage power to the controller 10, the heater drive circuit 40, the motor drive circuit 50, and other components of the image forming apparatus 1. The low-voltage power supply unit 30 includes circuits having capacitor components, coil components, and other components, and it is generally known that a phase difference between current and voltage occurs depending on the balance with a resistor.

This prevents current from flowing even in an instant of voltage being applied and thus prevents power from being effectively consumed.

The power detection device 100 according to the present exemplary embodiment obtains a power factor on the basis of a phase difference between a voltage zero-crossing signal P1 and a current zero-crossing signal P2 and calculates an active power by multiplying a voltage root-mean-square value, a current root-mean-square value, and the power factor together.

(2.1) Active Power

As illustrated in FIG. 4, the power detection device 100 is connected to the commercial power supply input side, and the voltage zero-crossing signal detection circuit 110 detects a voltage zero-crossing signal P1 from a sinusoidal instantaneous waveform of an alternating voltage. The alternating voltage undergoes full-wave rectification, smoothing by a smoothing capacitor, and A/D conversion by an A/D converter and thus has a voltage root-mean-square value Vrms.

The current zero-crossing signal detection circuit 120 is connected to the commercial power supply input side of the power detection device 100 with a resistor placed therebetween and detects a current zero-crossing signal P2 from a current instantaneous waveform. An alternating current undergoes A/D conversion by an A/D converter and thus has a current root-mean-square value Irms.

A power factor PF is obtained on the basis of a phase difference between the voltage zero-crossing signal P1 and the current zero-crossing signal P2 by referring to a table set in advance. An active power Pw (=Vrms×Irms×PF) is calculated by multiplying, by the power factor PF, an apparent power value Pva (=Vrms×Irms) calculated from the voltage root-mean-square value Vrms and the current root-mean-square value Irms.

(2.2) Waveforms in Zero-Crossing Signal Detection

As illustrated in FIG. 5A, the instantaneous waveform of the alternating voltage input from the commercial power supply has a sinusoidal pattern. The sinusoidal alternating voltage undergoes half-wave rectification in a group of the diodes CR1 and CR3 and a group of the diodes CR2 and CR4 of the voltage zero-crossing signal detection circuit 110 (see FIGS. 5B and 5C), respectively, and a full-wave rectified current Ipc flows through the photodiode PCa (see FIG. 5D).

A zero-crossing signal P (see FIG. 5E) is subsequently output from the emitter of the phototransistor PCb.

Meanwhile, the sinusoidal wave of 50 Hz AC power provided from the commercial power supply has a period of 20 ms, and the zero-crossing signal P is output every 10 ms.

(2.3) Power Factor Obtaining

FIG. 6A illustrates a relationship of alternating voltage among an instantaneous waveform, an effective waveform, and a zero-crossing signal. The horizontal axis represents time, and the vertical axis represents voltage. As illustrated in FIG. 6A, the voltage zero-crossing signal detection circuit 110 outputs the voltage zero-crossing signal P1 on the basis of the instantaneous waveform of the received alternating voltage.

FIG. 6B illustrates a relationship of alternating current among an instantaneous waveform, an effective waveform, and a zero-crossing signal. The horizontal axis represents time, and the vertical axis represents voltage. As illustrated in FIG. 6B, the current zero-crossing signal detection circuit 120 outputs the current zero-crossing signal P2 on the basis of the instantaneous waveform of the alternating current input through a resistor.

FIG. 6C illustrates a relationship between the voltage zero-crossing signal P1 detected and output by the voltage zero-crossing signal detection circuit 110 and the current zero-crossing signal P2 detected and output by the current zero-crossing signal detection circuit 120. As illustrated in FIG. 6C, the voltage zero-crossing signal P1 and the current zero-crossing signal P2 respectively detected by the voltage zero-crossing signal detection circuit 110 and the current zero-crossing signal detection circuit 120 have a time difference t based on a phase difference.

The voltage zero-crossing signal P1 and the current zero-crossing signal P2 are output to the controller 10, and the time difference t is calculated.

The calculated time difference t is converted into a power factor PF by referring to values in the table that are predetermined as power factors PF respectively estimated based on time differences.

Specifically, as illustrated in FIG. 7, the controller 10 receives the voltage zero-crossing signal P1 and the current zero-crossing signal P2. Time counting is started by using the timer function of a central processing unit (CPU), triggered by the voltage zero-crossing signal P1. Detection of a phase difference Tzc is performed, triggered by detection of the current zero-crossing signal P2.

Detection of a period Tf of the voltage zero-crossing signal P1 is subsequently performed, triggered by the next voltage zero-crossing signal P1.

A nonvolatile memory (NVM) of the controller 10 is used to hold the power factor table having the power factors PF each estimated for a range of the phase difference Tzc (from t1 to t2, from t3 to t4, . . . ) between the voltage zero-crossing signal P1 and the current zero-crossing signal P2, the power factors PF being estimated for each of the periods Tf of the voltage zero-crossing signal P1.

The controller 10 obtains one of the power factors PF by referring to the power factor table on the basis of the detected period Tf of the voltage zero-crossing signal P1 and the phase difference Tzc from the current zero-crossing signal P2.

(2.4) Active Power Calculation

The active power calculation unit 130 of the controller 10 calculates the active power Pw (=Vrms×Irms×PF) by multiplying the apparent power value Pva (=Vrms×Irms) by the power factor PF, the apparent power value Pva being calculated from the voltage root-mean-square value Vrms and the current root-mean-square value Irms, the power factor PF being obtained by referring to the power factor table on the basis of the period Tf of the voltage zero-crossing signal P1 and the phase difference Tzc from the current zero-crossing signal P2.

To calculate power consumption, the power detection device 100 according to the present exemplary embodiment does not perform high-frequency sampling on instantaneous alternating voltage and current values. The power detection device 100 instead obtains the power factor on the basis of the phase difference between the voltage zero-crossing signal P1 and the current zero-crossing signal P2 and calculates the active power by multiplying the voltage root-mean-square value, the current root-mean-square value, and the power factor together.

This may eliminate the need for providing a high-speed CPU serving as a computing device and a memory storing a huge number of instantaneous values obtained by sampling and may enable power consumption during operation of an apparatus to be detected as active power in real time.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A power detection device comprising:
a first zero-crossing detector that detects zero-crossing timing of an alternating voltage of power supplied from a commercial power supply and outputs a voltage zero-crossing signal;
a current detector that detects a current of the power supplied by the power supply; and
a second zero-crossing detector that detects zero-crossing timing of the current detected by the current detector and outputs a current zero-crossing signal,
wherein a power factor is obtained based on a phase difference between the voltage zero-crossing signal and the current zero-crossing signal, and an active power is calculated based on a root-mean-square value of the alternating voltage, a root-mean-square value of the current detected by the current detector, and the obtained power factor.

2. The power detection device according to claim 1, wherein the power factor is obtained by referring to a reference table predetermined using the phase difference between the voltage zero-crossing signal and the current zero-crossing signal.

3. An image forming apparatus comprising:
the power detection device according to claim 1; and
a power supply unit that converts the alternating voltage of power supplied from the commercial power supply into a direct current voltage and outputs a predetermined direct current voltage,
wherein the image forming apparatus is controlled in accordance with the voltage zero-crossing signal or the predetermined direct current voltage and forms an image.

4. A power detection method comprising:
detecting zero-crossing timing of an alternating voltage of a power supplied from a commercial power supply and outputting a voltage zero-crossing signal;
detecting a current of the power supplied by the power supply; and
detecting zero-crossing timing of the detected current and outputting a current zero-crossing signal,
wherein a power factor is obtained based on a phase difference between the voltage zero-crossing signal and the current zero-crossing signal, and an active power is calculated based on a root-mean-square value of the alternating voltage, a root-mean-square value of the detected current, and the obtained power factor.

* * * * *